US008827166B2

(12) United States Patent
Kuroda

(10) Patent No.: US 8,827,166 B2
(45) Date of Patent: Sep. 9, 2014

(54) SEALED SEMICONDUCTOR RECORDING MEDIUM AND SEALED SEMICONDUCTOR MEMORY

(75) Inventor: Tadahiro Kuroda, Kanagawa (JP)

(73) Assignee: Keio University, Tokyo (JP)

( * ) Notice: Subject to any disclaimer, the term of this patent is extended or adjusted under 35 U.S.C. 154(b) by 140 days.

(21) Appl. No.: 13/377,677

(22) PCT Filed: May 27, 2010

(86) PCT No.: PCT/JP2010/058970
§ 371 (c)(1),
(2), (4) Date: Dec. 12, 2011

(87) PCT Pub. No.: WO2010/143538
PCT Pub. Date: Dec. 16, 2010

(65) Prior Publication Data
US 2012/0091211 A1 Apr. 19, 2012

(30) Foreign Application Priority Data

Jun. 12, 2009 (JP) .................................. 2009-141403

(51) Int. Cl.
*G06K 19/06* (2006.01)
*H02J 5/00* (2006.01)
*H01L 27/112* (2006.01)
*H04B 5/00* (2006.01)
*H02J 7/02* (2006.01)

(52) U.S. Cl.
CPC ............... *H04B 5/0037* (2013.01); *H02J 5/005* (2013.01); *H04B 5/0081* (2013.01); *H01L 27/112* (2013.01); *H04B 5/0031* (2013.01); *H02J 7/025* (2013.01)
USPC .......................................... 235/492; 235/493

(58) Field of Classification Search
USPC .................................................. 235/492, 493
See application file for complete search history.

(56) References Cited

U.S. PATENT DOCUMENTS

| 6,900,721 B1* | 5/2005 | Urbas et al. ................. 340/10.51 |
| 2009/0267848 A1* | 10/2009 | Kuroda .......................... 343/720 |
| 2010/0214817 A1* | 8/2010 | Imai et al. ..................... 365/103 |

FOREIGN PATENT DOCUMENTS

JP          2006072826 A  *  3/2006

(Continued)

OTHER PUBLICATIONS

D. Stewart Peck; "Comprehensive Model for Humidity Testing Correlation", IEEE/IRPS, 1986, pp. 44-50.

(Continued)

*Primary Examiner* — Sonji Johnson
(74) *Attorney, Agent, or Firm* — Westerman, Hattori, Daniels & Adrian, LLP

(57) ABSTRACT

The invention relates to a sealed semiconductor recording medium and a sealed semiconductor memory and provides at low cost a sealed semiconductor memory with high reliability that can allow wireless data communication to be carried out at high speed without interference. At least one semiconductor substrate is provided with a number of read only memory blocks having such a size that the maximum side is 20 mm or less in such a state that the read only memory blocks do not share a power source wire, wherein each of the above-described read only memory blocks has a coil for power reception and a coil for data communication, and data different from each other are written in the above-described read only memory blocks.

12 Claims, 13 Drawing Sheets

(56) References Cited

FOREIGN PATENT DOCUMENTS

| | | | | |
|---|---|---|---|---|
| JP | 2006127363 | A | * | 5/2006 |
| JP | 2006320182 | A | * | 11/2006 |
| JP | 2007034711 | A | * | 2/2007 |
| JP | 2009087229 | A | * | 4/2009 |

OTHER PUBLICATIONS

Yuxiang, Yuan et al.; "Non- Contact 10% Efficient 36m W Power Delivery Using On-Clip Inductor in 0.18-μm CMOS"; IEEE Asian Solid—State Circuits Conference, Nov. 12-14, 2007 / Jeju, Korea, pp. 115-118.

* cited by examiner (a)

(b)

(a)

(b)

SEALED SEMICONDUCTOR RECORDING MEDIUM AND SEALED SEMICONDUCTOR MEMORY

TECHNICAL FIELD

The present invention relates to a sealed semiconductor recording medium and a sealed semiconductor memory, and for example, relates to a structure for supplying power to a sealed semiconductor recording medium that is completely isolated from the outside without affecting data communication and a structure for reading out the written data at a high speed.

BACKGROUND ART

In recent years, the cultural heritage of man has been digitalized because digital signals change little through the ages in comparison with analog signals, and thus are appropriate for storage over a long period of time. However, digital recording apparatuses so far cannot keep data stored for 100 years or more.

For example, it is said that hard disc devices for storing data using magnetism have a life of approximately 30 years. This is because a problem often occurs in the mechanism for making a data reading apparatus approach a disc that is rotating at a high speed.

It is said that optical disc devices for CDs (compact discs), DVDs and Blu-ray discs (registered trademark) have a life of approximately 15 years. This is because a problem often happens in the rotating parts, and in addition, the transmittance of light lowers due to the change in the material for coating the surface of a disc over time.

Thus, digital recording devices have a life of only approximately several tens of years, and sooner or later they will be out of order. Therefore, digital data must be periodically copied in a new recording apparatus for storage over a long period of time. This operation is referred to as migration.

The cost for migration is high, which becomes a large economic burden. For example, it is said that the cost for digitally storing three copies of one two-hour film with 4K digital cinema quality (4096×2160 pixels, 24 frames per second) is ¥1,000,000 or higher per year. Furthermore, it is said that the cost for storing all the fragments created in the manufacturing process of one digital film is ¥20,000,000 or higher per year.

Therefore, a new digital recording device for storage over a longer period of time has been demanded. If digital data can be stored for 1,000 years or more without any problems, migration is not necessary, which makes it possible to leave cultural heritage for the next generation at a lower cost.

Conceptual ideas of a number of wafers on which mask ROMs (read only memories) are formed are layered on top of each other, and the entirety of which is sealed with $SiO_2$, have been proposed as a new digital recording device having a potential of achieving the above (see Non-Patent Document 1).

Semiconductor integrated circuit devices, such as mask ROMs, are manufactured by processing silicon as the main material along with other materials, for example, silicon oxide films, and metals, such as copper. Silicon and silicon oxide are very stable substances and have such a feature that their quality does not change over 1,000 years. Meanwhile, metals are oxidized in an environment of a high temperature and high humidity, which causes rusting or corrosion.

In semiconductor integrated circuit devices, metals are used for wiring circuits, and thus are used inside the device covered with a silicon oxide film or a silicon nitride film. Metals are exposed to the outside of the device only through an opening in the silicon oxide film or the silicon nitride film, which is referred to as a pad, for the connection with wires outside of the device for the power supply and data communication (wire bonding). In the case where moisture enters into the device through this opening, the internal metal wires corrode and sooner or later causes a problem.

Digital data is recorded in a mask ROM as a pattern of contacts for the connection between metal wire layers using a mask for lithography during the manufacturing process for the device. As compared to the systems for writing data using a charge or magnetism, the mask ROM, in accordance with the contact method, is strong against a change in the environment or noise in terms of radiation (cosmic rays) and electromagnetism (geomagnetism) and has such features that data can be stored over a long period of time as long as the metal wires do not corrode.

In the case where a mask ROM is sealed with a silicon oxide film or a silicon nitride film without an opening for a pad as proposed above, moisture can be prevented from entering into the device from the outside, and therefore it is expected that the life of the chip can be made to be 1,000 years or more.

FIG. 13 is a graph illustrating the dependency of the life of chips on humidity in accordance with the report of research concerning the life of chips (see Non-Patent Document 2). As shown in FIG. 13, in the case where the humidity inside a chip can be made to be 2% or less, the life of the chip is 1,000 years or more even when the temperature of the chip is 100° C.

From the point of view of the manufacturing cost, it is expensive to fabricate a mask to be used only once in order to write data, such as of a film, in this mask ROM. There is a technology for directly irradiating the resist on a wafer with an electron beam using an apparatus for direct drawing with an electron beam (EB), which substitutes a mask. The use of this technology makes it possible to write data into a mask ROM at a low cost.

As of 2009, a 4-gigabit mask ROM can be manufactured in a 1 cm square chip at a cost of approximately ¥200 by using a 45 nm CMOS technology. Accordingly, a 2.5-terabit mask ROM can be manufactured at approximately ¥140,000 by layering four 15-inch (approximately 38 cm) wafers on top of each other.

In ten years, the integration density of semiconductor integrated circuits will be 100 times greater, and thus the cost per bit could be expected to be $\frac{1}{100}$. Accordingly, it is predicted that in 2020, 6-terabit digital data could be stored in one 4.75-inch (approximately 12 cm) wafer, which is the same size as DVDs, at a manufacturing cost of ¥1500.

Therefore, the remaining technical issues are how power is supplied to a sealed mask ROM and how the data can be read out. A technology, which is referred to as a wireless tag (RFID: radio frequency identification), is used as the technology for reading out data wirelessly while supplying power wirelessly.

This is an automatic recognition system for reading out or writing in individual pieces of information on people or things recorded in a medium, which is referred to as IC tag, through wireless communication (retrieving, registering, deleting and updating data), which is used for electronic money cards and electronic tickets, for example. The technology in the above-described Non-Patent Document 1 is also assumed to use such a system.

PRIOR ART DOCUMENTS

Patent Documents

Patent Document 1: Japanese Unexamined Patent Publication 2005-228981
Patent Document 2: Japanese Unexamined Patent Publication 2005-348264
Patent Document 3: Japanese Unexamined Patent Publication 2006-050354
Patent Document 4: Japanese Unexamined Patent Publication 2006-066454
Patent Document 5: Japanese Unexamined Patent Publication 2006-105630
Patent Document 6: Japanese Unexamined Patent Publication 2006-173986
Patent Document 7: Japanese Unexamined Patent Publication 2006-173415

Non-Patent Documents

Non-Patent Document 1: Hiroyuki Ochi, "Potential of Glass Disc Technology," http://note.dmc.keio.acjp/topics/archives/455.
Non-Patent Document 2: D. Stewart Peck, "Comprehensive Model for Humidity Testing Correlation," Intl. Rel. Phys. Symp., pp. 44-49, 1986.
Non-Patent Document 3: D. Mizoguchi et al., "A 1.2 Gb/s/pin Wireless Superconnect Based on Inductive Inter-Chip Signaling (ITS)," IEEE International Solid-State Circuits Conference (ISSCC'04), Dig. Tech. Papers, pp. 142-143, 517, February 2004.
Non-Patent Document 4: N. Miura et al., "Analysis and Design of Transceiver Circuit and Inductor Layout for Inductive Inter-chip Wireless Superconnect," Symposium on VLSI Circuits, Dig. Tech. Papers, pp. 246-249, June 2004.
Non-Patent Document 5: N. Miura et al., "Cross Talk Countermeasures in Inductive Inter-chip Wireless Superconnect," in Proc. IEEE Custom Integrated Circuits Conference (CICC'04), pp. 99-102, October 2004.
Non-Patent Document 6: N. Miura, D. Mizoguchi, M. Inoue, H. Tsuji, T. Sakurai, and T. Kuroda, "A 195 Gb/s 1.2 W 3D-Stacked Inductive Inter-Chip Wireless Superconnect with Transmit Power Control Scheme," IEEE International Solid-State Circuits Conference (ISSCC'05), Dig. Tech. Papers, pp. 264-265, February 2005.
Non-Patent Document 7: N. Miura, D. Mizoguchi, M. Inoue, K. Niitsu, Y Nakagawa, M. Tago, M. Fukaishi, T. Sakurai, and T. Kuroda, "A 1 Tb/s 3 W Inductive-Coupling Transceiver for Inter-Chip Clock and Data Link," IEEE International (ISSCC'06), Dig. Tech. Papers, pp. 424-425, February 2006.
Non-Patent Document 8: N. Miura, H. Ishikuro, T. Sakurai, and T. Kuroda, "A 0.14 pJ/b Inductive—Coupling Inter-Chip Data Transceiver with Digitally-Controlled Precise Pulse Shaping," IEEE International Solid-State Circuits Conference (ISSCC'07), Dig. Tech. Papers, pp. 264-265, February 2007.
Non-Patent Document 9: N. Miura, Y. Kohama, Y. Sugimori, H. Ishikuro, T. Sakurai, and T. Kuroda, "An 11 Gb/s Inductive-Coupling Link with Burst Transmission," IEEE International Solid-State Circuits Conference (ISSCC'08), Dig. Tech. Papers, pp. 298-299, February 2008.
Non-Patent Document 10: Y. Yuxiang, Y. Yoshida, and T. Kuroda, "Non-Contact 10% Efficient 36 mW Power Delivery Using On-Chip Inductor in 0.18-um CMOS," IEEE Asian Solid-State Circuits Conference (A-SSCC'07), Dig. Tech. Papers, pp. 115-118, November 2007.

SUMMARY OF THE INVENTION

Problem to be Solved by the Invention

The rate of reading data out of wireless tags is approximately 250 kilobit per second. Accordingly, it takes 115 days or more to read out 2.5-terabit digital data. In order to read out this data in approximately two hours, the communication rate needs to be several hundred megabits per second, which is approximately 1,000 times faster.

In addition, while the reader is supplying power to a wireless tag, data is carried by the electromagnetic waves when the electromagnetic waves are reflected from the tag, and thus data communication is carried out. This system is referred to as a back scatter system (system for dispersing modulated signal to the rear). In this system, it is very difficult to carry out high-speed communication of several hundred megabits per second.

In wireless tags, an antenna used for power supply and communication (having a coil form in many cases) and a capacitor used to store power are connected to the chip for a tag through wires on a printed circuit board. In order to secure the reliability over a long period of time, it is necessary to seal the system during the semiconductor manufacturing process, and thus such a problem arises that an external coil or capacitor cannot be used.

As a high-speed communication means, the inventor has proposed an electronic circuit for communication through inductive coupling between IC chips that are layered on top of each other and mounted on the substrate via coils formed of wires on the chips (see Patent Documents 1 to 7 and Non-Patent Documents 3 to 9). This technology can be used to make the communication rate be 1 gigabit or higher per second. Patent Document 5, for example, proposes a chip test by carrying out communication through inductive coupling between the chip and a test head in a LSI chip test unit.

When this technology is used as it is, however, there is a problem that power cannot be supplied through coupling between magnetic fields. This is because electromagnetic waves for supplying power wirelessly and electromagnetic waves for data communication interfere with each other, and thus the reliability of the data communication significantly deteriorates.

The distance for communication between the reader, which becomes the power supplying source and the data communication source, and the stone, which is a sealed semiconductor recording medium, needs to be at least 0.5 mm, and the distance is enough when it is 3 mm. Though the wafer can be shaved to as thin as approximately 50 μm, the thickness of a protective film, such as an SiN film, is required. When the distance for communication is 1 mm, the diameter of the coil for data communication needs to be approximately 2 mm. Here, a pair of coils: one for data communication, and the other for its timing clock signal, is required. In the case where coils dedicated for communication from the stone to the reader and for communication from the reader to the stone are separately prepared, four coils in total are necessary.

When the distance for communication is 1 mm and the diameter of the coil for data communication is 2 mm, the coupling coefficient k of the coil for data communication (ratio of coupling of transmitting and receiving coils: in the case of complete coupling, the coefficient is 1, and in the case of no coupling, the coefficient is 0) is approximately 0.15 and the voltage signal generated in the receiving coil is approximately 150 mV. Accordingly, in the case where a coil of which the diameter is smaller than 2 mm is used when the distance for communication is 1 mm, the value of k is significantly small and the voltage of the receiving signal is significantly small, and thus data communication cannot be carried out.

Meanwhile, the diameter of the coil for power supply needs to be approximately 6 mm when the distance for communication is 1 mm. At this time, k is approximately 0.4. The ratio ($P_{RX}/P_{TX}$) of the power $P_{RX}$ transmitted by the reader to the power $P_{TX}$ received by the stone is approximately k to the second power. In the case of the above-described conditions, $P_{RX}/P_{TX} \cong k^2 = 0.4^2 = 0.16$. Accordingly, in the case where a coil having a diameter of less than 6 mm is used when the distance for communication is 1 mm, the value of k is significantly small and the received power is significantly small, and thus a sufficient power cannot be supplied to the circuit in the stone.

Incidentally, the upper limit of the power transmitted by the reader is given as $V_{DD}^2/R$ when R is the impedance of the power transmitting circuit. The impedance R of the power transmitting circuit is approximately 5Ω, which is the sum of the resistance of the coil and the resistance of the transistors in the transmitting circuit. Accordingly, the upper limit of the power transmitted by the reader is $V_{DD}^2/R=1.8^2/5 \cong 650$ mW in the case of $V_{DD}=1.8$ V.

0.16 times the maximum transmitted power of 650 mW is transmitted to the receiving coil through inductive coupling ($P_{RX}/P_{TX}=0.16$), and therefore 100 mW is transmitted. Furthermore, approximately 30% is converted to a direct current power source in a rectifying circuit, which thus supplies 30 mW. In the case where the power consumption required by the stone is assumed to be 120 mW, four coils having a diameter of 6 mm are required.

When a coil for data communication having a diameter of 2 mm and a coil for power having a diameter of 6 mm are provided for the reader and the stone respectively, there must be a distance of at least 8 mm between the two coils or the electromagnetic waves for supplying power wirelessly affect the data communication, which makes the bit error rate in the data communication too large not to be allowed. The four coils for power can be provided adjacent to each other because no major problem arises even though there is slight interference among them. However, the four coils for data communication must be provided at a distance 2 mm or more away from each other or there is interference between the pieces of data.

Accordingly; four coils for power supply having a minimum diameter of 6 mm and four coils for data communication having a minimum diameter of 2 mm must be provided in such a manner that the coils for power and the coils for data communication are away from each other by a minimum distance of 8 mm, and the coils for data communication are away from each other by a minimum distance of 2 mm in order to prevent the electromagnetic waves for supplying power wirelessly and the electromagnetic waves for data communication from interfering with each other. As a result, the size of the chip needs to be at least 22 mm×14 mm.

When the maximum side of a chip for a semiconductor integrated circuit is greater than 20 mm, however, such a problem arises that the yield for manufacture significantly lowers. Furthermore, in the case where the maximum side of a chip exceeds 20 mm, exposure to light is generally impossible with one reticle, and therefore it is necessary to connect a number of reticles, which increases the cost and the probability of defects. Accordingly, it is necessary for the yield to be high to a certain degree in order to reduce the cost, and thus the size of the chip must be such that the maximum side is smaller than 20 mm.

This means that there is a dilemma such that the coils for power supply and the coils for data communication must be provided in a chip having a maximum side smaller than 20 mm, and thus electromagnetic waves interfere with each other between these coils, which significantly lowers the reliability of data communication.

In addition, the capacitor mounted in the semiconductor chip does not have a sufficient capacitance, and therefore such a problem arises that the alternating current component cannot be made sufficiently small when power is carried by an alternating current signal through coupling between magnetic fields so as to be transmitted, and a power supplying voltage is gained by converting the received alternating current signal to a direct current signal in a rectifying circuit.

The above-described Non-Patent Document 1 proposes that the chips share a power source, and when chips share a power source, a defect in one chip could cause a malfunction in all the chips that share the power source. In the case where there is a short circuit in the power source, for example, the power source voltage is not sufficiently high in all the chips that share the power source, and thus such a problem arises that the circuits do not operate normally.

Furthermore, it is necessary to connect a number of chips provided on one wafer with metal wires in order for the chips to share the power source. In order to achieve this, it is necessary to form wires for connecting chips to each other across scribing regions where no wires are formed according to the prior art. In the case where stones are cut out from a wafer having a large diameter, however, the form of wires may become abnormal on the surface cut by scribing, which may cause short circuiting between $V_{DD}$ and the substrate (GND), and thus such a problem may arise that the reliability lowers.

In order to mass produce a sealed semiconductor recording medium having high reliability at a low cost, it is essential for it to be able to be mass produced without adding extra processes or extra components by using a technology having high reliability where the manufacturing process is established. In the case where the above-described chip having a size of 22 mm×14 mm or greater is used, for example, the yield for manufacture significantly lowers, which increases the cost greatly.

Accordingly, an object of the present invention is to provide at a low cost a sealed semiconductor memory with high reliability where it is possible to supply power wirelessly, and at the same time, it is possible to carry out wireless data communication at high speed without interference.

Means for Solving Problem

In order to achieve the above-described object, the sealed semiconductor memory medium according to the present invention has: at least one semiconductor substrate provided with a number of read only memory blocks having such a size that the maximum side is 20 mm or less in such a state that the read only memory blocks do not share a power source wire, wherein each of the above-described read only memory blocks has a coil for power reception and a coil for data communication, and data written in the above-described read only memory blocks are different from each other.

Thus, the block size, which corresponds to the chip size, is such that the maximum side is 20 mm or less, and therefore it is possible to mass produce a sealed semiconductor recording medium at low cost using a manufacturing technology of which high reliability has been established. In addition, the read only memory blocks do not share the power source, and therefore a defect in one read only memory block does not cause a malfunction of all the read only memory blocks, unlike in the case where they share the same power source.

In addition, in the sealed semiconductor memory medium according to the present invention, each of the above-described read only memory blocks further has a time division means for receiving power and for carrying out data communication in different time slots.

Thus, a time division means is provided, and therefore power can be received and data communication can be carried out in different time slots, and as a result, the electromagnetic waves for supplying power and the electromagnetic waves for data communication do not interfere with each other, which can make the bit error ratio in the data communication be within an allowable range. In addition, when a time division means is provided, it is possible to provide a coil for power reception and a coil for data communication in close proximity, which can make the maximum side be 20 mm or less, for example, approximately 15 mm.

In addition, in the sealed semiconductor memory medium according to the present invention, each of the above-described read only memory blocks further has a smoothing means for smoothing alternating current power received by the above-described coil for power reception, and in particular it is desirable to have a mechanism for smoothing alternating current power received by the above-described coil for power reception by shifting the phases of the alternating current power away from each other.

Thus, when a smoothing means is provided, the supplied alternating current power can be stored in the parasitic capacitor in the wiring portion for forming a mask ROM as a direct current power. In particular, when a mechanism for smoothing alternating current power received by the above-described coil for power reception by shifting the phases of the alternating current power away from each other is provided, it is possible to keep the ratio of the ripples in the power source voltage to the power source voltage $V_{DD}$ at 10% or less. As a result, it is possible for the circuit to operate normally.

In addition, in the sealed semiconductor memory medium according to the present invention, the above-described semiconductor substrate is sealed with a silicon nitride film.

Thus, when the semiconductor substrate is sealed with a silicon nitride film having excellent resistance to weather, moisture can be prevented from entering without fail, and thus a further increase in the life of the semiconductor substrate is possible. Incidentally, the above-described Non-Patent Document 2 expects a life of 1,000 years or more.

Furthermore, in the sealed semiconductor memory medium according to the present invention, a number of semiconductor substrates having read only memory blocks provided in the same arrangement where data written in the read only memory blocks are different from each other are layered on top of each other in such a manner that the above-described read only memory blocks overlap each other when projected.

Thus, when a number of semiconductor substrates having the same arrangement are layered on top of each other so that the read only memory blocks overlap each other when projected, the memory capacity can be increased in accordance with the number of layers.

In addition, the sealed semiconductor memory according to the present invention has: the above-described sealed semiconductor recording medium; and a reader made of a semiconductor substrate where a number of reader blocks having a coil for power supply to the above-described sealed semiconductor recording medium and a coil for data communication are provided, wherein the coils for power supply and the coils for data communication provided in the above-described reader blocks and the coils for power reception and the coils for data communication provided in the above-described read only memory blocks respectively overlap and face each other when projected.

Though the reader may be provided with one reader block, a number of reader blocks can be provided so that the rate of reading out data can be made high speed as compared to the number of reader blocks.

In this case, it is desirable for the coils for power supply and the coils for data communication provided in the above-described reader blocks and the coils for power reception and the coils for data communication provided in the above-described read only memory blocks to face each other with a distance of 3 mm or less in between in order for the power to be efficiently supplied and received and for the data communication to be efficiently carried out.

Effects of the Invention

The sealed semiconductor recording medium and the sealed semiconductor memory, which have been disclosed in the specification, make it possible to provide a sealed semiconductor memory with high reliability that can allow wireless data communication to be carried out at high speed without interference.

PREFERRED EMBODIMENTS OF THE INVENTION

Figure 1:
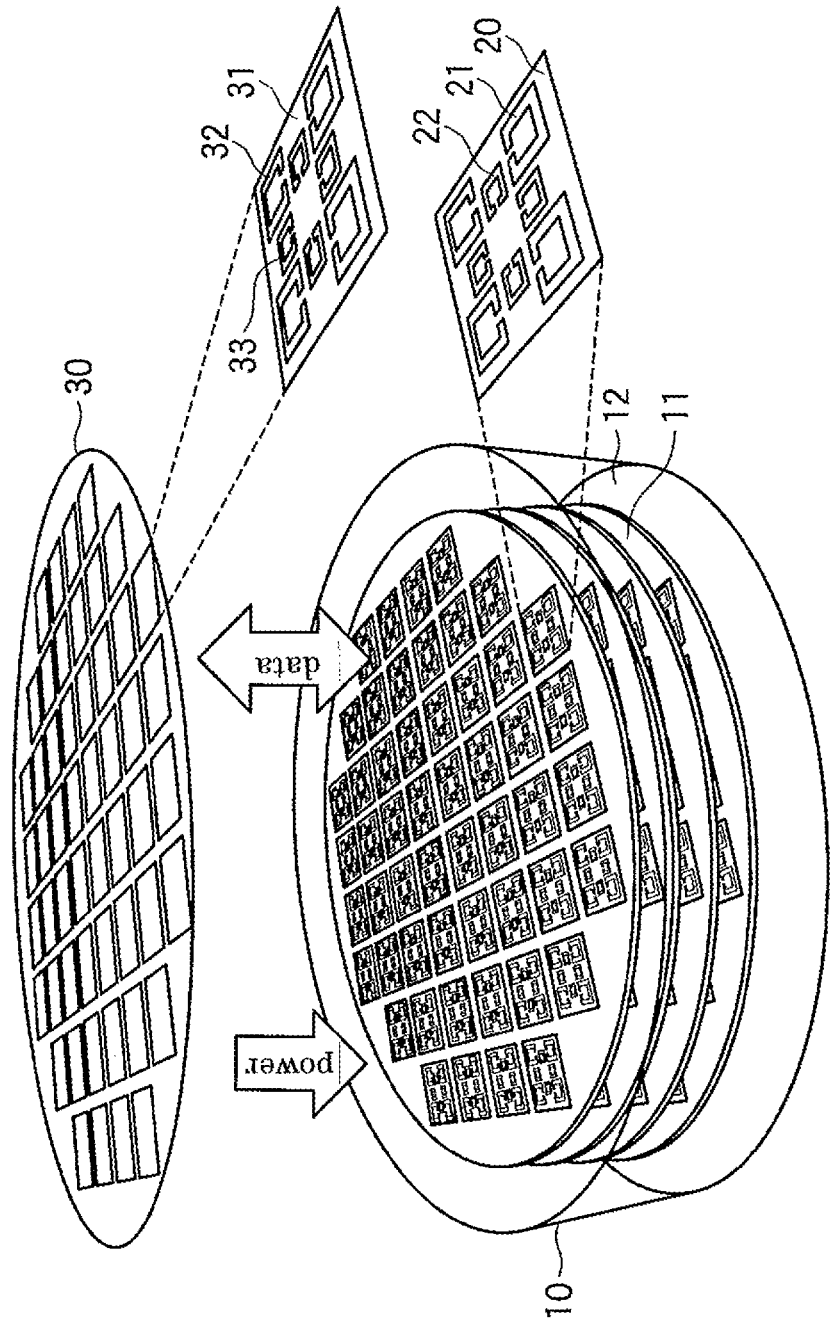
FIG. 1 is a schematic diagram showing the structure of the sealed semiconductor memory according to an embodiment of the present invention.

An embodiment of the present invention is described below in reference to FIGS. 1 to 2(b). FIG. 1 is a schematic perspective diagram showing the sealed semiconductor memory according to one embodiment of the present invention, which is formed of a digital Rosetta stone 10 for storing data and a reader 30 for reading out the stored data.

The digital Rosetta stone 10 has a number of wafers 11, where ROM blocks 20 in which a mask ROM, a coil for power reception 21, a coil for data communication 22 and a wireless communication circuit are integrated are aligned, layered on top of each other so that the ROM blocks 20 overlap each other when projected and is sealed with a protective film 12, such as of SiN or $SiO_2$.

In the reader 30, the same number of reader blocks 31 as the ROM blocks 20 are aligned, wherein in each reader block 31 a coil for power supply 32 and a coil for data communication 33, which correspond to a coil for power reception 21 and a coil for data communication 22 provided in a wafer 11 and have the same shape, and a data wireless communication circuit are integrated. When electromagnetic waves for power are emitted from a coil for power supply 32 provided in a reader block 31, they are received in order by the coils for power reception 21 provided in ROM blocks 20 in the wafers 11 in the different layers and overlap with the coil for power supply 32 when projected while attenuating. This is the same for the electromagnetic waves for data communication.

The minimum number of reader blocks 31 provided in the reader 30 is 1 and the maximum number is the same number as the ROM blocks 20, and the rate of reading out data can be increased in proportion to the number of reader blocks 31. In the case where the number of reader blocks 31 is smaller than the number of ROM blocks 20, the reader 30 can be moved over the digital Rosetta stone 10 so that data can be read out from each ROM block 20.

Figure 2:
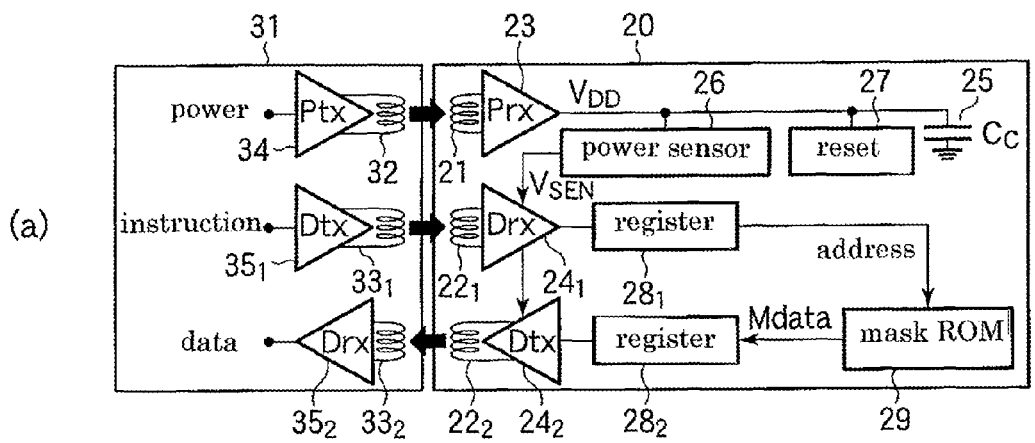
FIGS. 2(a) and 2(b) are a schematic diagram and a graph illustrating the structure of power communication and data communication.
Figure 2:
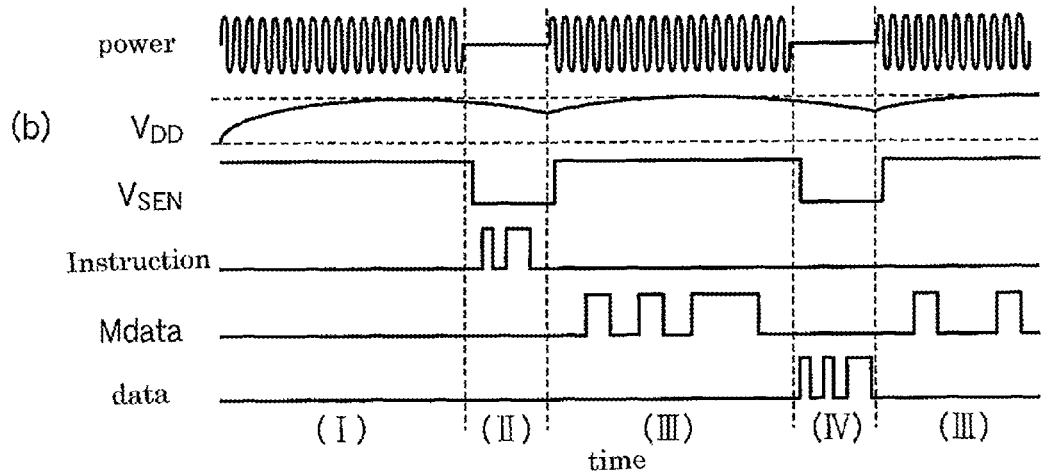

FIGS. 2(*a*) and 2(*b*) are a diagram and a graph for illustrating the structures of power communication and data communication. FIG. 2(*a*) is a schematic circuit block diagram for power communication and data communication, and FIG. 2(*b*) is a chart showing the power communication and data communication system. As shown in FIG. 2(*a*), a coil for power supply 32, as well as a coil for data transmission $33_1$ and a coil for data reception $33_2$, which are coils for data communication, are provided on the reader block 31 side, and an amplifier for power 34, an amplifier for data transmission $35_1$ and an amplifier for data reception $35_2$ are respectively connected to each coil.

Meanwhile, a coil for power supply 21, as well as a coil for data reception $22_1$ and a coil for data transmission $22_2$, which are coils for data communication, are provided on the ROM block 20 side, and a power rectifier 23, an amplifier for data reception $24_1$ and an amplifier for data transmission $24_2$ are respectively connected to each coil.

In addition, a capacitor 25 for charging the supplied power is connected to the power rectifier 23, and at the same time, a power sensor 26 and a power-on-reset circuit 27 are connected to the power rectifier 23. This capacitor 25 is the parasitic capacitance on the power source line in the circuit in the ROM block 20 or the parasitic capacitance to which a capacitance created by using the gate of a MOS FET is added, for example. Resistors $28_1$ and $28_2$ are respectively connected to the amplifier for data reception $24_1$ and the amplifier for data transmission $24_2$, and the resistors $28_1$ and $28_2$ are connected to mask ROMs 29.

As shown in FIG. 2(*b*), in the power communication and data communication system according to the present invention, power communication and data communication are carried out alternately in their respective time slots so that electromagnetic waves do not interfere, and the following four procedures are repeated.

First Procedure (I): First, power is wirelessly transmitted from a reader block 31 to a ROM block 20 through coupling between magnetic fields. The supplied power is stored in the capacitor 25 formed on the chip. It is detected that the potential $V_{DD}$ of the power source in the ROM block 20 has risen to a predetermined potential using the power sensor 26, and then the system is reset using the power-on-reset circuit 27.

Second Procedure (II): The power supply from the reader block 31 to the ROM block 20 is stopped. The ROM block 20 consumes the power, and therefore the potential $V_{DD}$ of the power source in the ROM block 20 gradually lowers. The power sensor 26 detects this change at a high speed. When it is detected that the power supply has been stopped, the wireless receiver is started up so as to receive an instruction from the reader block 31 and stores it in the resistor $28_1$. This instruction designates the initial address and the last address of the data that is read out from the ROM block 20 by the reader block 31 between the following third procedure and fourth procedure, for example. Alternatively, it is instructed to stop the wireless communication instrument in advance in preparation for the restart of the power supply in the following third procedure. The wireless receiver operates using the energy stored in the capacitor 25. Accordingly, the value of $V_{DD}$ gradually lowers, but the time for the second procedure is determined from the power consumption by the circuit so that the value of $V_{DD}$ does not lower to a predetermined value or less.

Third Procedure (III): The power supply from the reader block 31 to the ROM block 20 is restarted. When the ROM block 20 detects this, the data (MDATA) is read out from the mask ROM so as to be stored in the resistor $28_2$. During this time, the circuit operates using the supplied power.

In the fourth procedure (IV), the power supply from the reader block 31 to the ROM block 20 is stopped. When the long block 20 detects this, the wireless transmitter is started to wirelessly transmit the data stored in the register $28_2$ to the reader block 31. The wireless transmitter operates using the energy stored in the capacitor 25. Accordingly, the value of $V_{DD}$ gradually lowers and the time for the fourth procedure is determined from the power consumed by the circuit so that the value of $V_{DD}$ does not lower to a certain value or less.

The above-described third procedure and fourth procedure are repeated so that all of the desired data is read out. After the reading out of the data is completed, no power is supplied from the reader block 31, and soon the power source voltage $V_{DD}$ in the ROM block 20 becomes zero and the process returns to the first procedure.

It is desired to keep the ratio $V_R/V_{DD}$ of the ripple $V_R$ to the power source voltage $V_{DD}$ at 10% or less when $V_R$ is the ripple that remains when the alternating current signal generated by the coil for receiving the power source is converted to a direct current voltage in a rectifying circuit. When $V_R/V_{DD}$ is 10% or greater, the circuit does not operate normally.

The ratio $V_R/V_{DD}$ of the ripple $V_R$ to the power source voltage $V_{DD}$ is represented by the following formula where f is the frequency of the electromagnetic waves for power supply, C is the parasitic capacitance on the power source line, and R is the impedance of the circuit for the mask ROM.

$$V_R/V_{DD} = 1/(fCR)$$

The majority of the circuit for the mask ROM is formed of n channel MOSFETs and only a small number of p channel MOSFETs are used, and therefore the parasitic capacitance on the power source line is very small, and, for example, C=1 nF. In addition, the impedance R of the circuit for the mask ROM is approximately 25Ω, for example.

Accordingly, when the frequency f of the electromagnetic waves for power supply is 250 MHz, $V_R/V_{DD}=1/(fCR)=1/(250\,MHz \times 1\,nF \times 25\Omega) \cong 0.16$, which is 16%. That is to say, the ripple is read in the circuit for the mask ROM. In order to solve this problem, according to the present invention, the power transmission is divided into a number of channels so that the phases of the electromagnetic waves for the respective channels are made different from each other, and thus the ripple is reduced.

In addition, when the ROM blocks share the power source, a defect in one ROM block could be a factor of a malfunction for all of the ROM blocks that share the power source. When there is short circuiting in the power source, for example, the power source voltage is not sufficiently high for all the ROM blocks that share the power source, and thus the circuit does not operate normally.

According to the present invention, however, the ROM blocks are electrically isolated from each other, and therefore even if one ROM block operates defectively, the data is coded redundantly when stored, and thus the data can be completely recovered. When a low density parity check (LDPC) code is used, for example, the amount of data can be increased by 23% for repair.

Example 1

Figure 3:
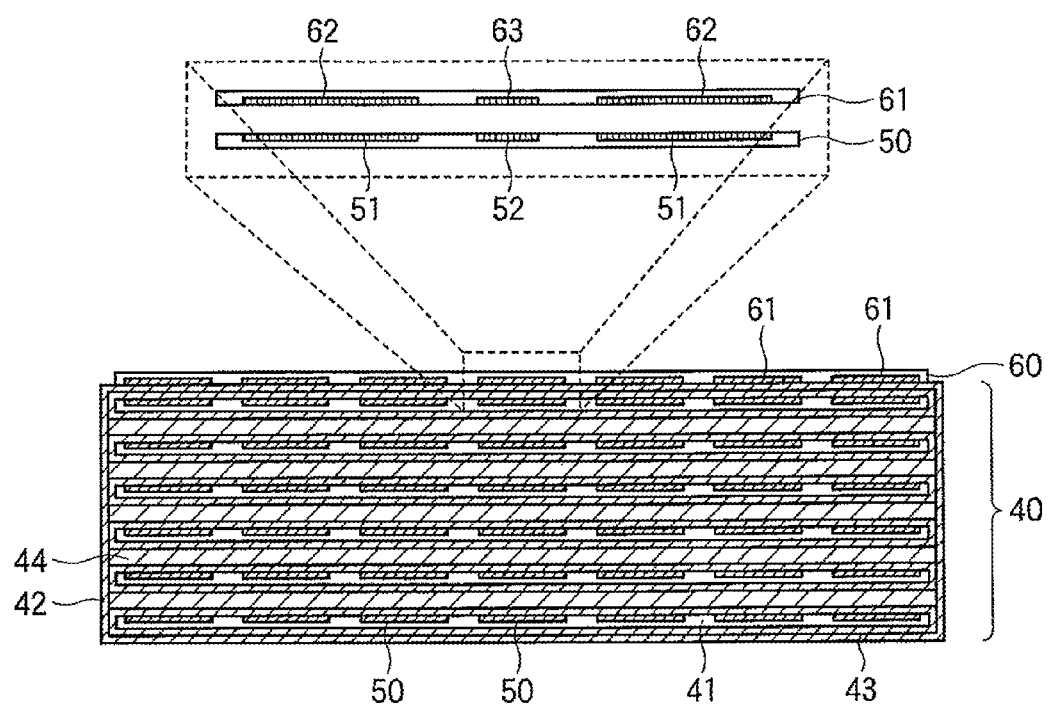
FIG. 3 is a schematic cross-sectional diagram showing the sealed semiconductor memory according to Example 1 of the present invention.

Under the above-described assumption, the sealed semiconductor memory according to Example 1 of the present invention is described next. FIG. 3 is a cross-sectional diagram showing the sealed semiconductor memory according to Example 1 of the present invention, which is formed of a digital Rosetta stone 40 for storing data and a reader 60 for reading out the stored data.

The digital Rosetta stone 40 is formed of a number of wafers 41 where ROM blocks 50, in which mask ROMs, coils for power reception 51, coils for data communication 52 and wireless communication circuits are integrated, are aligned, and the wafers 41 are layered on top of each other in such a manner that the ROM blocks 50 overlap when projected and are sealed with an SiN protective film 42 in the same manner as in FIG. 1. The wafers 41 are individually covered with an SiN protective film 43, and the wafers 41 are layered on top of each other in accordance with a technology for pasting substrates together using an $SiO_2$ film 44.

In the reader 60, the same number of reader blocks 61, where coils for power supply 62 and coils for data communication 63 having the same forms corresponding to the coils for power reception 51 and coils for data communication 52 provided in the wafers 41 and wireless communication circuits for data are integrated, as the number of ROM blocks 50 are provided.

Figure 4:
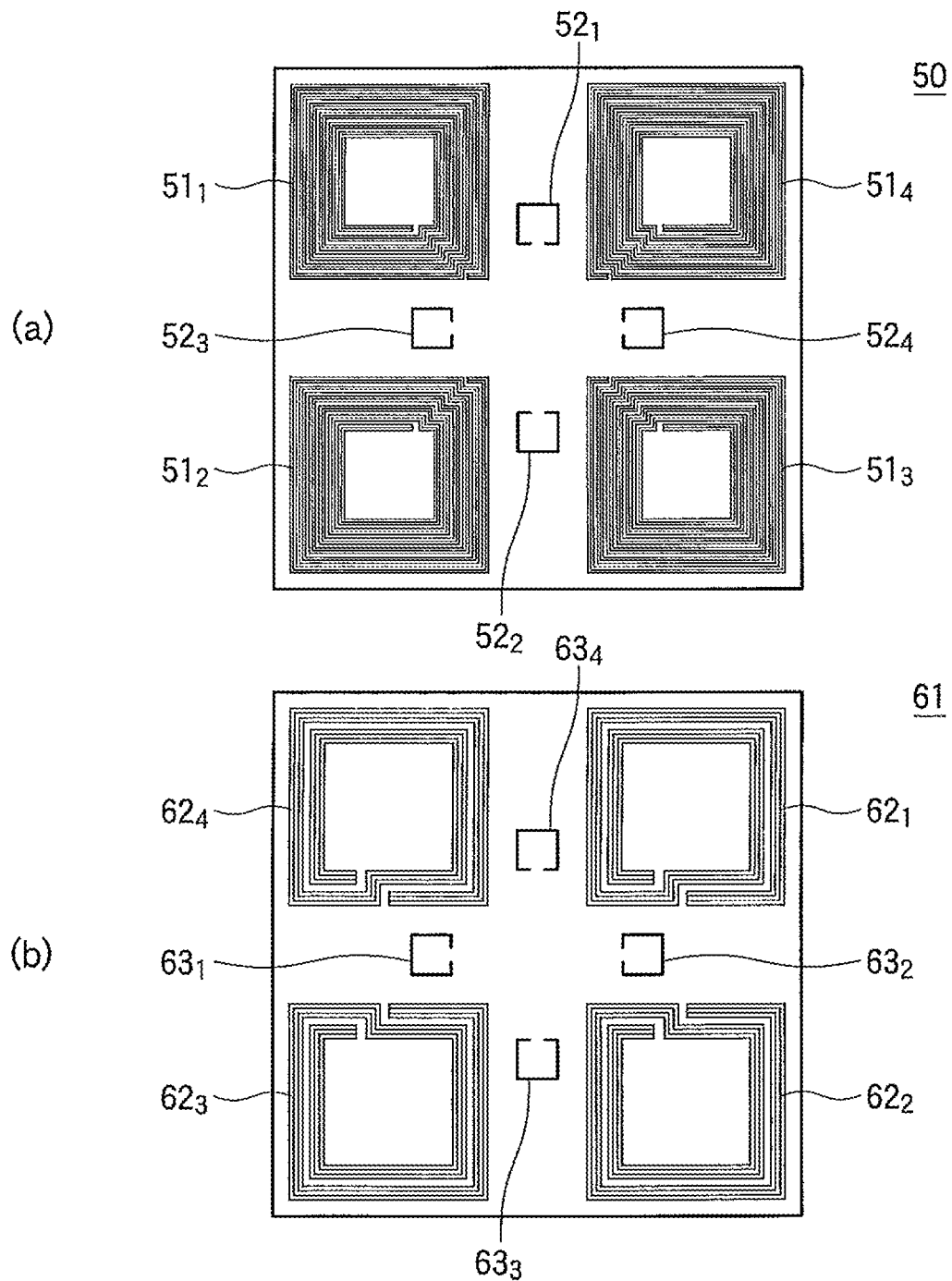
FIGS. 4(a) and 4(b) are plan diagrams showing examples of a ROM block and a reader block.

FIGS. 4(a) and 4(b) are plan diagrams showing examples of a ROM block and a reader block. FIG. 4(a) is a plan diagram showing a ROM block where four coils for power reception $51_1$ to $51_4$ having sides of 6 mm are provided in a ROM block 50 having a size of 15 mm×15 mm, and at the same time, coils for data communication $52_1$ to $52_4$ having sides of 1.2 mm are aligned in cross form. Two of the four coils for data communication $52_1$ to $52_4$ are for transmission and the other two are for reception.

FIG. 4(b) is a plan diagram showing a reader block where four coils for power supply $62_1$ to $62_4$ having sides of 6 mm are provided in a reader block 61 having a size of 15 mm×15 mm, and at the same time, four coils for data communication $63_1$ to $63_4$ having sides of 1.2 mm are aligned in cross form. Two of the four coils for data communication $63_1$ to $63_4$ are for transmission and the other two are for reception. The distance for communication between the reader block 61 and the ROM block 50 is 0.6 mm at this time.

Here, the coils for power supply 62 and the coils for data communication 63 have substantially the same sides and are arranged in the same manner as the coils for power reception 51 and the coils for data communication 52 provided in the ROM block 50. The coils are provided in such a manner that the coils for data communication $63_3$ and $63_4$ for transmission face the coils for data communication $52_2$ and $52_1$ for reception, and the coils for data communication $63_1$ and $63_2$ for reception face the coils for data communication $52_4$ and $52_3$ for transmission.

Figure 5:
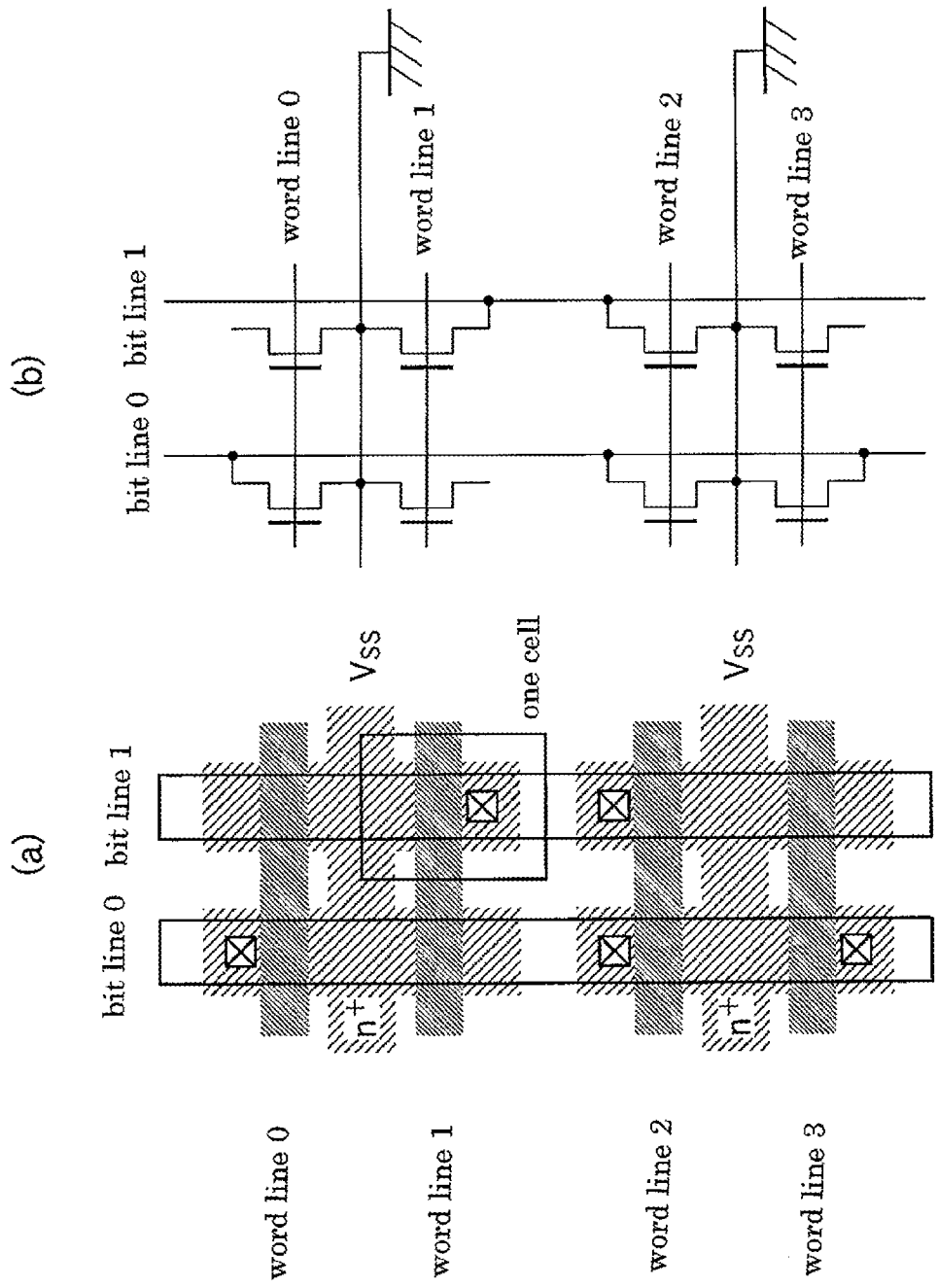
FIGS. 5(a) and 5(b) are diagrams illustrating the structure of a mask ROM.

FIGS. 5(a) and 5(b) are diagrams illustrating the structure of a mask ROM, where FIG. 5(a) is a schematic plan diagram and FIG. 5(b) is an equivalent circuit diagram.

Figure 6:
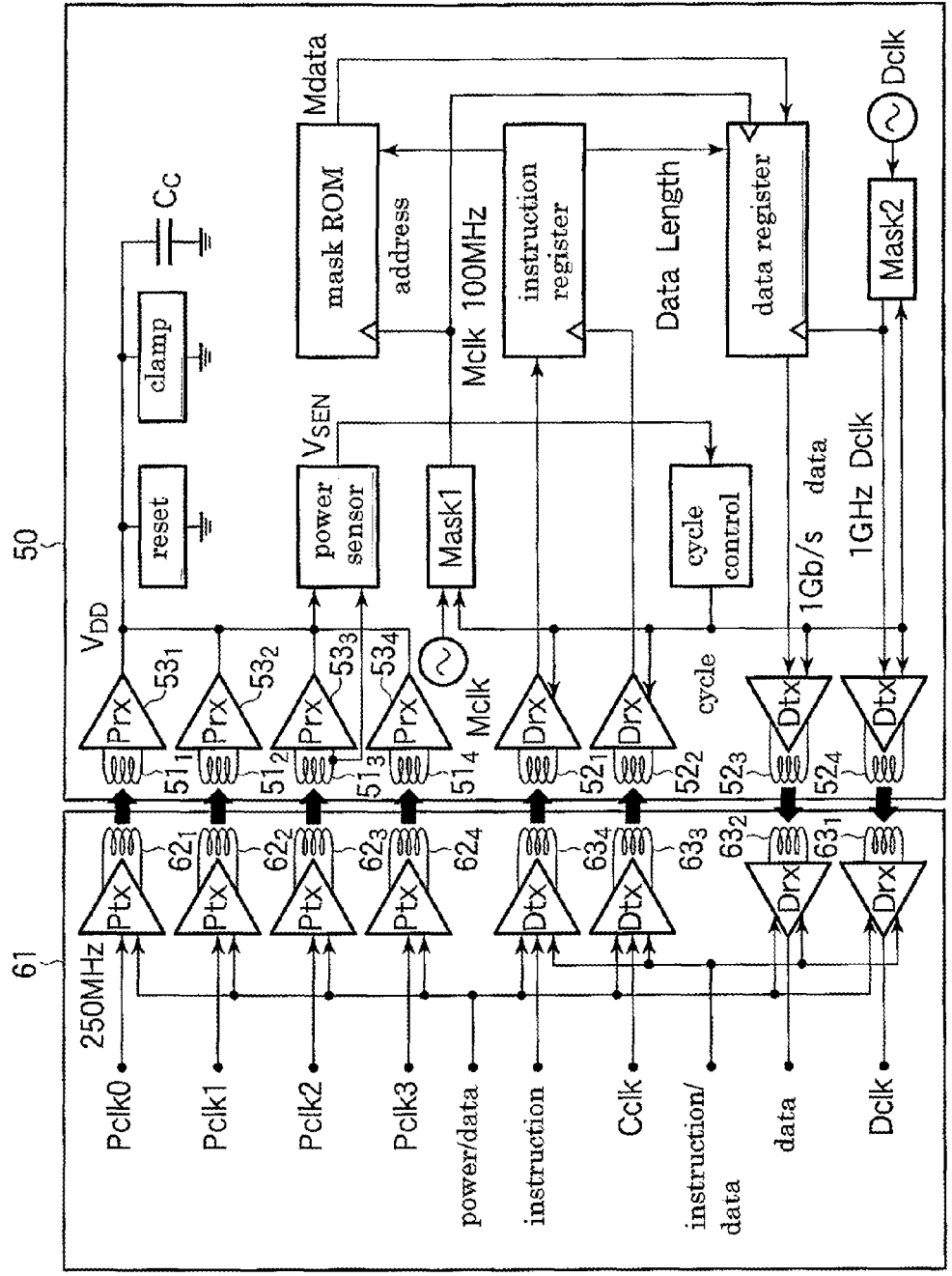
FIG. 6 is a circuit block diagram for power communication and data communication according to Example 1 of the present invention.

FIG. 6 is a circuit block diagram for power communication and data communication according to Example 1 of the present invention. As shown in the figure, the coils for power supply $62_1$ to $62_4$ and the coils for power reception $51_1$ to $51_4$ face each other. As described below, alternative current voltages of which the phases are different from each other by 45° are applied to the coils for power supply $62_1$ to $62_4$. In addition, the coils for data communication $63_3$ and $63_4$ for transmission and the coils for data communication $52_2$ and $52_1$ for reception face each other, and the coils for data communication $63_1$ and $63_2$ for reception and the coils for data communication $52_4$ and $52_3$ for transmission face each other. Here, as for the coils for data communication, a coil for data communication and a coil for its timing clock signal form a pair.

A clock $M_{clk}$ of 100 MHz, for example, is used to read out data from a mask ROM, and a clock $D_{clk}$ of 1 GHz, for example, is used to wirelessly transmit data in the data register from the ROM block 50 to the reader block 60.

These clocks oscillate for output only when necessary and are stopped when unnecessary so as to avoid wasting power. In some cases, several clocks immediately after the start of the oscillating of the clock have a small amplitude or a large jitter, and therefore circuits $Mask_1$ and $Mask_2$ for preventing the use of the clocks are used. Typically, the number of clocks is counted by a counter, and the initial two clocks are not used while the third clock onward are used.

Figure 7:
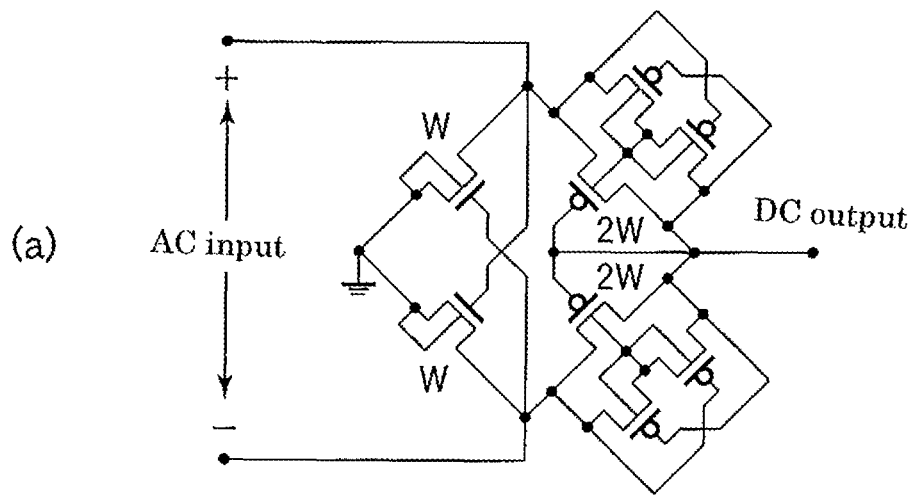
FIGS. 7(a) and 7(b) are schematic diagrams illustrating the structures of a full-wave rectifier and a power sensor.
Figure 7:
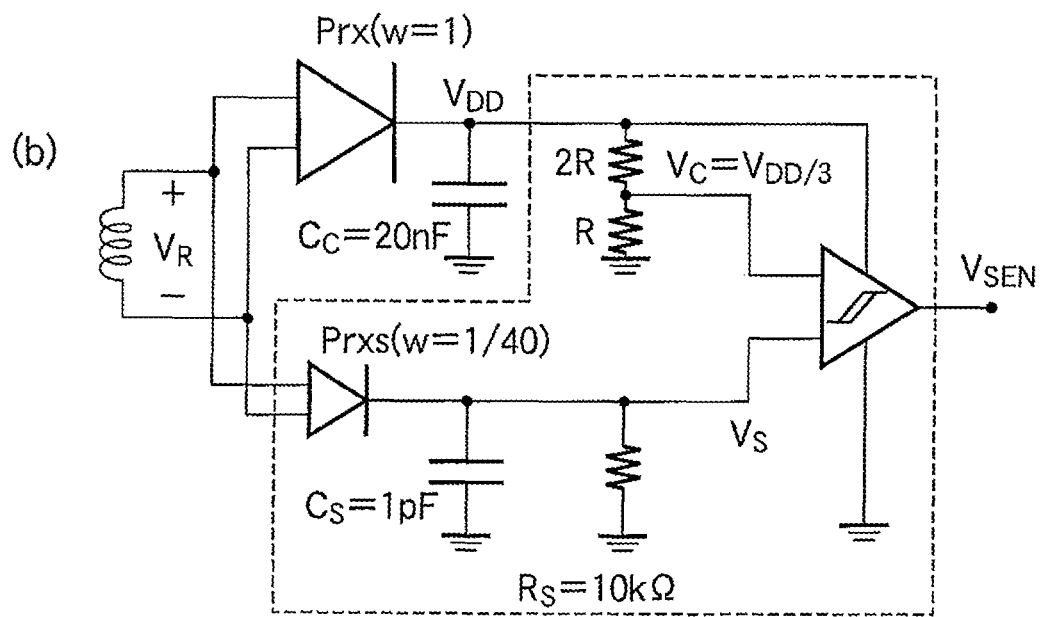

FIG. 7(a) is a diagram showing the circuit structure of a full-wave rectifier, which is an example of a power rectifier $P_{rx}$ (see Non-Patent Document 10). In addition, FIG. 7(b) is a diagram showing the structure of a power sensor that detects whether wireless transmission of power from a reader block to a ROM block has begun or stopped. The power transmitting waves received by the ROM block are converted from an alternating current to a direct current by using the full-wave rectifier shown in FIG. 7(a).

In the power sensor shown in FIG. 7(b), the output $V_S$ of a replica circuit $P_{rxs}$ (w=1/40), where the rectifying circuit and the output load capacitance of the power rectifier $P_{rx}$ are scaled down, and the potential $V_C$, which is 1/3 of $V_{DD}$, are compared by a comparator, and the ROM block detects whether wireless transmission has started or stopped.

Figure 8:
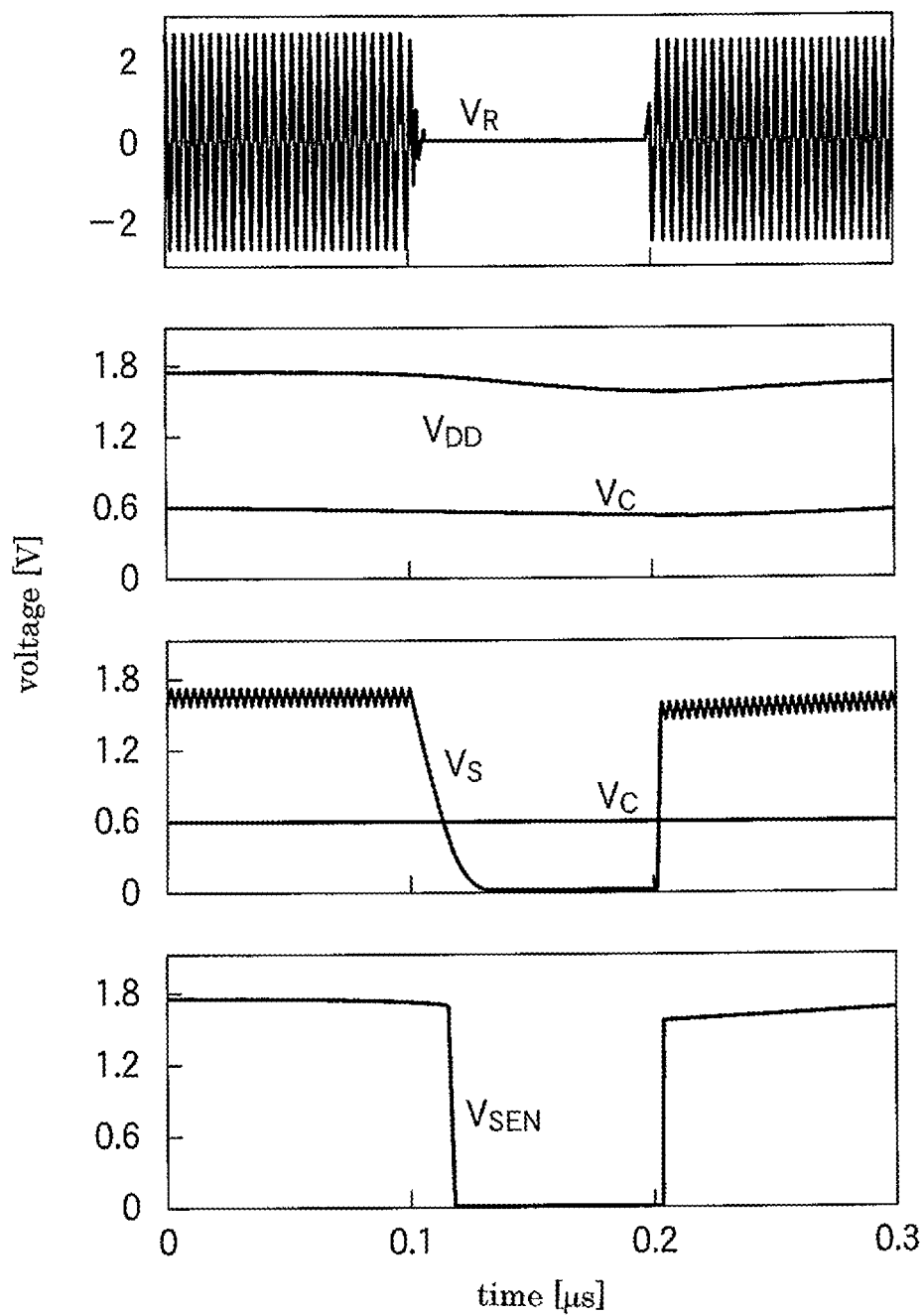
FIG. 8 is a diagram illustrating chronological change in the outputs in FIGS. 7(a) and 7(b)

That is to say, as the chronological change in the outputs is changed in FIG. 8, when wireless power transmission from the reader block to the ROM block has been stopped, $V_S$ lowers and becomes lower than the potential $V_C$, which is 1/3 of $V_{DD}$, so that the output $V_{SEN}$ of the comparator changes to the low, and thus the ROM block detects that the power transmission has been stopped. Meanwhile, when wireless power transmission from the reader block to the ROM block has been started, $V_S$ increases and becomes higher than the potential $V_C$, which is 1/3 of $V_{DD}$, so that $V_{SEN}$ changes to the high, and thus the long block detects that the power transmission has been restarted. In this case, it is desirable for the comparator to be a hysteresis comparator where the reference threshold value has hysteresis properties so that the comparator does not malfunction due to noise.

Figure 9:
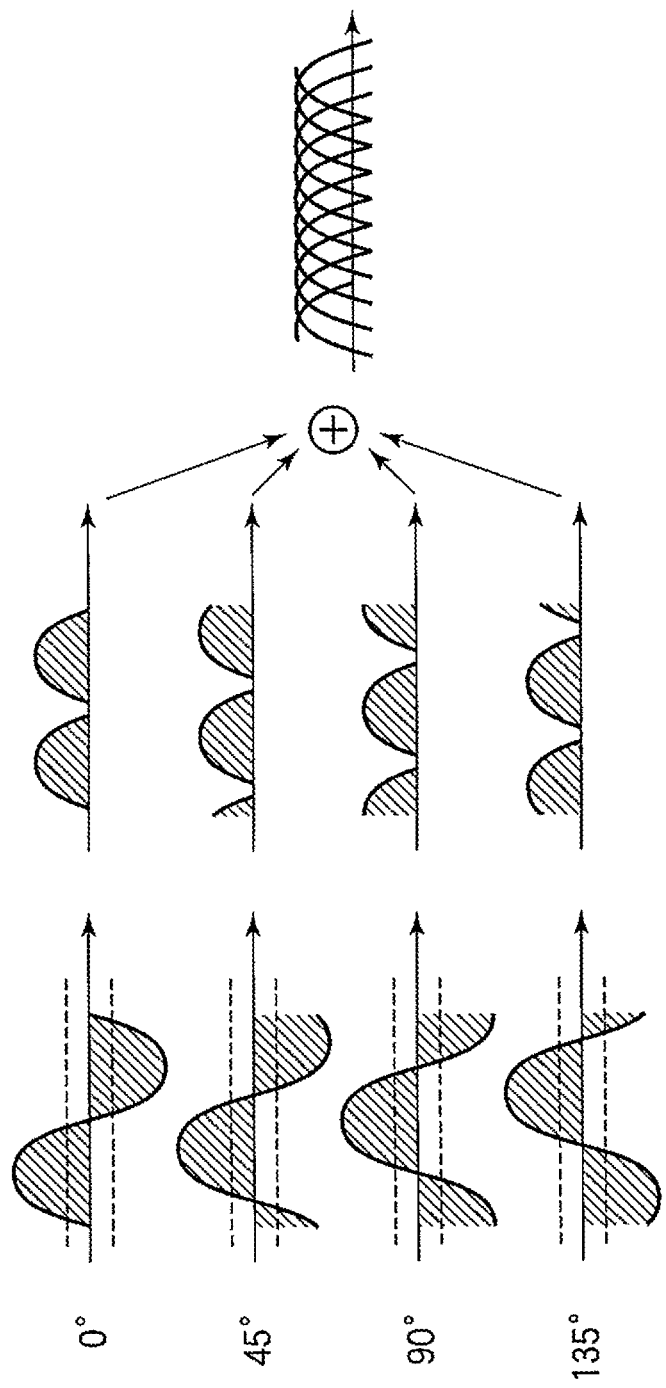
FIG. 9 is a diagram illustrating four-channel full-wave rectification.

FIG. 9 is a diagram illustrating four-channel full-wave rectification. A number of communication channels are used to transmit power from the reader block 61 to the ROM block 50, and the phases of the channels are made different from each other so that the fluctuation (ripple) in the power source voltage $V_{DD}$ of the long block that has been received and rectified is made small.

When four alternating currents of which the phases are different from each other by 45° are transmitted using four communication channels, as shown in FIG. 9, a large fluctuation in the power source remains in each power source voltage gained through the corresponding channel. When the outputs of the four power supplying channels are added, the ripples compensate for the mutual fluctuations, and as a result, the ripple value can be made very small.

Figure 10:
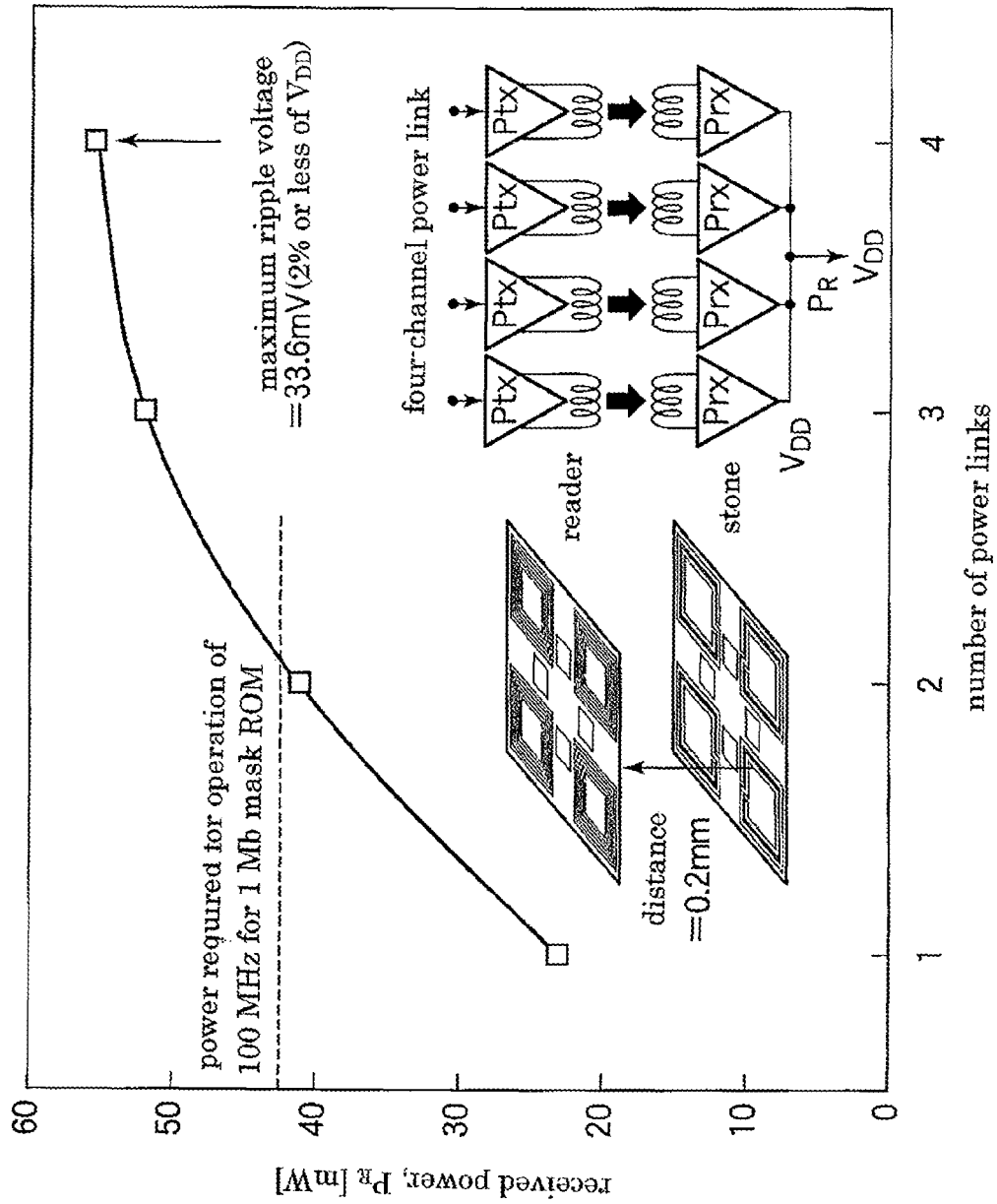
FIG. 10 is a diagram illustrating ripple voltage in wireless power supply through four power channels.

FIG. 10 is a diagram illustrating the results of wireless power supply using four power channels where chips in which the size of the coils and the like are scaled down to ⅓ are actually prototyped, and the distance for communication is set to ⅓ for the power supply test. Here, the test is performed for the reader block and the ROM block of which the gap is set to 0.2 mm and where the coils for power provided in the chips of a 5 mm square have a side of 2 mm. As a result, it was verified through experiments that the power required for the operation of 100 MHz for the mask ROM can be wirelessly transmitted, and at the same time, the maximum ripple voltage of the power source that has been converted to a direct current is $V_R$=33.6 mV, which is as small as 2% or less of $V_{DD}$.

Figure 11:
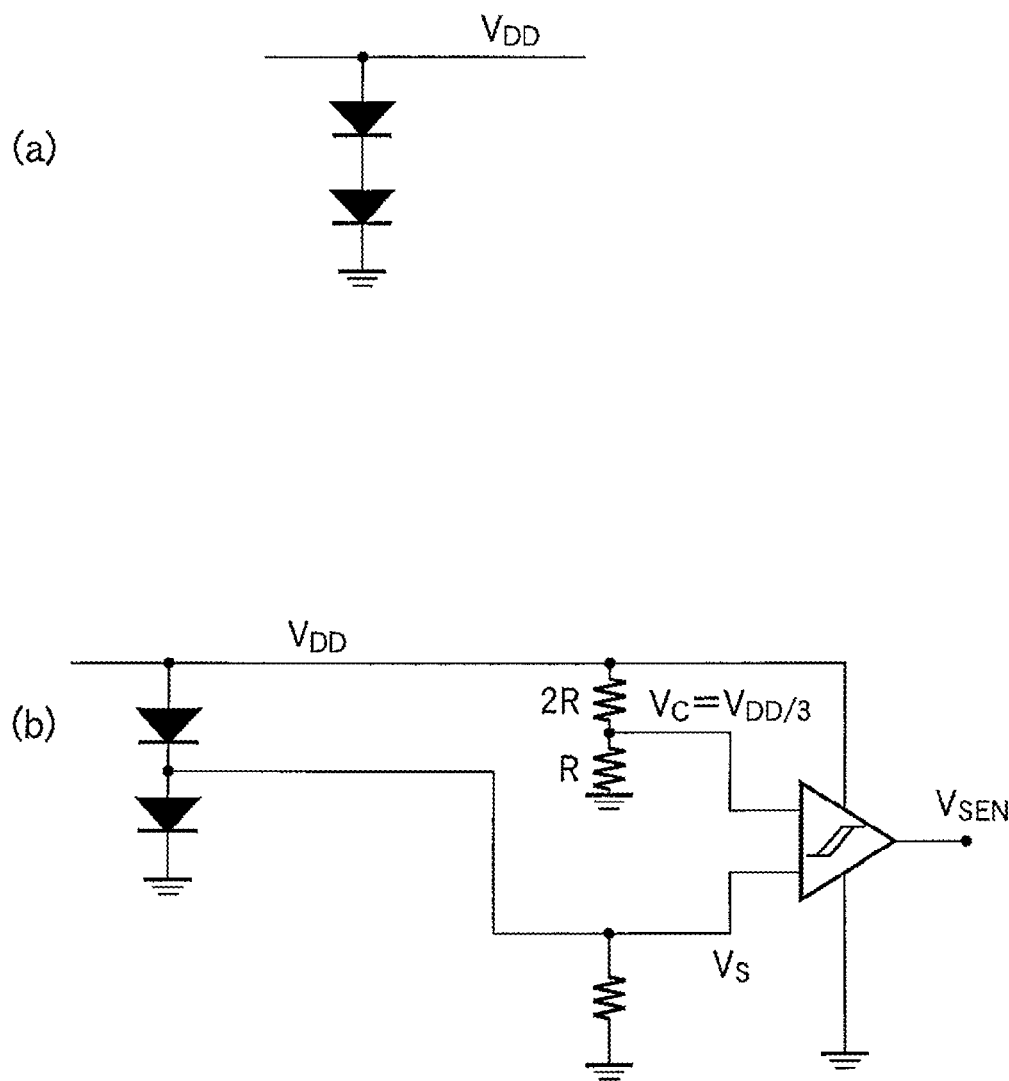
FIGS. 11(a) and 11(b) are circuit diagrams showing the structures of a clamp circuit and an excessive power sensor.

FIG. 11(a) is a circuit diagram showing an example of the clamp circuit in FIG. 6, and a clamp circuit for 1.2 V can be formed by connecting two diodes in series when the voltage drop in the forward direction of each diode is 0.6 V. That is to say, when the power supply voltage $V_{DD}$ is 1.2 V, the diodes allow a current to flow in the forward direction so as to prevent $V_{DD}$ from rising. Here, these diodes may be substituted with MOSFETs where the gate and the drain are connected to each other.

FIG. 11(b) shows an example of a circuit for detecting that the clamp circuit has started operating. When the excessive power is released to the GND by the clamp circuit, $V_S$ is higher than $V_{DD}$/3, which makes $V_{SEN}$ high. When the power supply is excessive, heat is generated as the power is released by the clamp circuit. In order to prevent such heat from being generated, the reader block is notified that the power supply is excessive through wireless communication, and feedback control is carried out so that the power transmitted by the reader block is released.

Example 2

Figure 12:
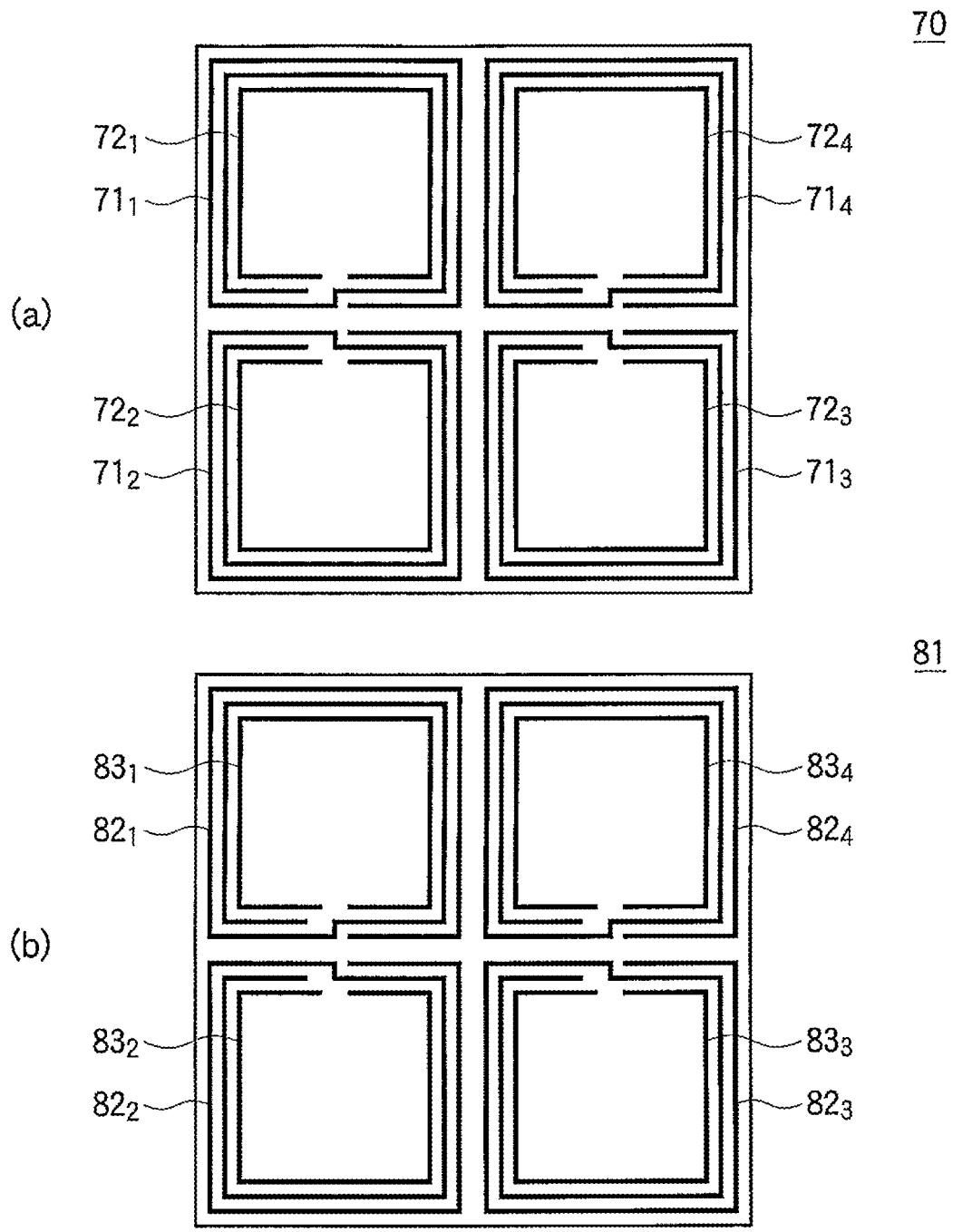
FIGS. 12(a) and 12(b) are schematic plan diagrams showing the ROM block and the reader block according to Example 2 of the present invention.
Figure 13:
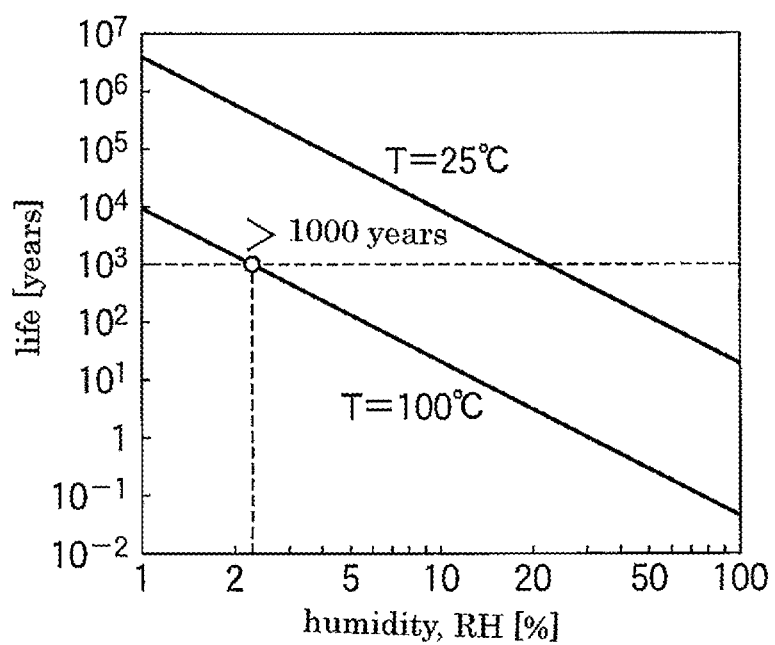
FIG. 13 is a graph illustrating the dependency of the chip life on humidity.

Next, the sealed semiconductor memory according to Example 2 of the present invention is described in reference to FIGS. 12(a) and 12(b). The basic structure is the same as in the above-described Example 1, except the difference in the coil arrangement, and therefore only the coil arrangement is described below.

FIGS. 12(a) and 12(b) are schematic plan diagrams showing a ROM block and a reader block in Example 2 of the present invention. FIG. 12(a) is a schematic plan diagram showing a ROM block where four coils for power reception $71_1$ to $71_4$ having a side of 7 mm are provided in a ROM block 70 having a size of 15 mm×15 mm, and at the same time, four coils for data communication $72_1$ to $72_4$ having a side of 6 mm are aligned in concentric form inside the coils for power reception $71_1$ to $71_4$. Two of the four coils for data communication $72_1$ to $72_4$ are for transmission and the other two are for reception.

FIG. 12(b) is a schematic plan diagram showing a reader block where four coils for power supply $82_1$ to $82_4$ having a side of 7 mm are provided in a reader block 81 having a size of 15 mm×15 mm, and at the same time, four coils for data communication $83_1$ to $83_4$ having a side of 6 mm are provided in concentric form inside the coils for power supply $82_1$ to $82_4$. Two of the four coils for data communication $83_1$ to $83_4$ are for transmission and the other two are for reception.

In this case, it is desirable to allocate the coil for data communication $72_1$, which is in the upper left in the figure (coil for data communication $83_4$, which is in the upper right as corresponding with one reverse side), and the coil for data communication $72_3$, which is in the lower right (coil for data communication $83_2$, which is in the lower left as corresponding with one reverse side) to the data communication and timing communication for the communication from the reader to the stone, and to allocate the coil for data communication $72_4$, which is in the upper right (coil for data communication $83_1$, which is in the upper left as corresponding with one reverse side) and the coil for data communication $72_2$, which is in the lower left (coil for data communication $83_3$, which is in the lower right as corresponding with one reverse side) to the data communication and the timing communication for the communication from the stone to the reader.

At this time, the communication from the reader to the stone and the communication from the stone to the reader are carried out in different time slots so that a pair of coils for data communication, with one for data and the other for timing, are not adjacent horizontally but away from each other diagonally by approximately 1.4 times greater when communicating at the same time, and thus the interference between the coils for data communication can be reduced.

In Example 2 of the present invention as well, the power is supplied and data communication is carried out in different time slots, and therefore the electromagnetic waves do not interfere, and accordingly it is possible to provide the coils for data communication inside the coils for power.

As a result, the size of the coils for data communication can be increased with the distance between the reader and the digital Rosetta stone being increased, and thus it is possible to read out the data even when the distance is 3 mm, for example.

The invention claimed is:

1. A sealed semiconductor memory medium, comprising:
at least one semiconductor substrate provided with a number of read only memory blocks having such a size that the maximum side is 20 mm or less in such a state that the read only memory blocks do not share a power source wire,
wherein each of said read only memory blocks comprises a coil for power reception and a coil for data communication, and data written in said read only memory blocks are different from each other,
wherein each of said read only memory blocks has four coils for power reception, and said coil for data communication comprises two coils for data communication for transmission of which the size is smaller than that of said coils for power reception and two coils for data communication for reception of which the size is smaller than that of said coils for power reception.

2. The sealed semiconductor memory medium according to claim 1, wherein said four coils for power supply are arranged in a 2×2 matrix, and the coils for data communication from among said two coils for data communication for transmission and said two coils for data communication for reception are provided in the regions between two adjacent coils for power reception, respectively.

3. The sealed semiconductor memory medium according to claim 2, wherein said two coils for data communication for transmission are aligned along a first straight line and said two coils for data communication for reception are aligned along a second straight line, where said first straight line and said second straight line are perpendicular to each other and said second straight line runs between said two coils for data communication for transmission.

4. The sealed semiconductor memory medium according to claim 3, wherein said four coils for power reception are provided in the four regions separated by said first and second straight lines, respectively.

5. The sealed semiconductor memory medium according to claim 1, wherein each of said read only memory blocks comprises a time division means for receiving power and for carrying out data communication in different time slots.

6. The sealed semiconductor memory medium according to claim 1, wherein each of said read only memory blocks comprises a smoothing means for smoothing alternating current power received by said coil for power reception.

7. The sealed semiconductor memory medium according to claim 6, wherein said smoothing means comprises a mechanism for smoothing alternating current power received by said coil for power reception by shifting the phases of the alternating current power away from each other.

8. The sealed semiconductor memory medium according to claim 1, wherein said read only memory blocks comprise a feedback control mechanism for informing said coil for data communication that the power supplied to said coil for power reception exceeds the preset value.

9. The sealed semiconductor memory medium according to claim 1, wherein said semiconductor substrate is sealed with a silicon nitride film.

10. The sealed semiconductor memory medium according to claim 1, wherein a number of semiconductor substrates having read only memory blocks provided in the same arrangement where data written in the read only memory blocks are different from each other are layered on top of each other in such a manner that said read only memory blocks overlap each other when projected.

11. A sealed semiconductor memory, comprising:
the sealed semiconductor recording medium according to claim 1; and
a reader made of a semiconductor substrate where a number of reader blocks comprising a coil for power supply to said sealed semiconductor recording medium and a coil for data communication are provided, wherein
the coils for power supply and the coils for data communication provided in said reader blocks and the coils for power reception and the coils for data communication provided in said read only memory blocks respectively overlap and face each other when projected.

12. The sealed semiconductor memory according to claim 11, wherein the coils for power supply and the coils for data communication provided in said reader blocks and the coils for power reception and the coils for data communication provided in said read only memory blocks face each other with a distance of 3 mm or less in between.

* * * * *